United States Patent [19]
Van De Plassche et al.

[11] Patent Number: 5,742,203
[45] Date of Patent: Apr. 21, 1998

[54] GAIN-CONTROLLABLE AMPLIFIER, RECEIVER

[75] Inventors: Rudy J. Van De Plassche, Eindhoven; Petrus J. G. Van Lieshout, Nijmegen, both of Netherlands

[73] Assignee: U.S. Philips Corporation, New York, N.Y.

[21] Appl. No.: 543,731

[22] Filed: Oct. 16, 1995

[30] Foreign Application Priority Data

Oct. 28, 1994 [EP] European Pat. Off. ............ 94203139

[51] Int. Cl.⁶ .................... H03F 3/45; H03G 3/30
[52] U.S. Cl. ........................................... 330/254
[58] Field of Search .................... 330/9, 254, 278, 330/279; 348/707

[56] References Cited

U.S. PATENT DOCUMENTS

| | | | |
|---|---|---|---|
| 4,396,891 | 8/1983 | Johansson et al. | 330/254 |
| 4,453,256 | 6/1984 | Ryu | 375/15 |
| 4,740,996 | 4/1988 | Somer | 375/76 |
| 5,355,534 | 10/1994 | Kimura | 455/323 |
| 5,418,494 | 5/1995 | Botti et al. | 330/254 |
| 5,432,475 | 7/1995 | Fukahori | 330/254 |
| 5,587,688 | 12/1996 | Mulbrook | 330/254 X |

FOREIGN PATENT DOCUMENTS 0102946  3/1984  European Pat. Off. .

*Primary Examiner*—Steven Mottola
*Attorney, Agent, or Firm*—Edward W. Goodman

[57] ABSTRACT well as a receiver having low noise and low distortion. These functional units include at least one transadmittance stage having differential transistor pairs coupled in parallel. Gain control is effectuated by varying the unbalance in the differential transistor.

11 Claims, 11 Drawing Sheets

GAIN-CONTROLLABLE AMPLIFIER, RECEIVER

BACKGROUND OF THE INVENTION

1. Field Of The Invention

The invention generally relates to gain controllable amplifiers and receivers. Many receivers Comprise gain controllable amplifiers to compensate for amplitude variations of a received signal. For example, television receivers have gain regulation circuits that bring the amplitude of an intermediate frequency signal to a reference level.

2. Description Of The Related Art

More specifically, the invention relates to a type of gain controllable amplifier comprising at least one controllable transadmittance stage formed by a plurality of differential pairs coupled in parallel which have mutually coupled control terminals to which an input signal can be applied and which have mutually coupled main current terminals from which an output signal can be taken. A gain controllable amplifier of this type is known from EP-A-0,102,946, corresponding to U.S. Pat. No. 4,502,018.

FIG. 1 shows the known gain controllable amplifier which effectively comprises three differential transistor pairs coupled in parallel. The multi-emitter transistor pair TR51–TR52 can be divided into a first differential pair with emitters E1A–E2A, a second differential pair with emitters E1B–E2B and a third differential pair with emitters E1C–E2C. Since the surface of emitter E1A is equal to that of emitter E2A, The first differential pair is balanced. Since the surfaces of their respective emitters are unequal, the other differential pairs are unbalanced. The balanced differential pair constitutes a high-gain transadmittance stage which has a relatively small input signal range. The unbalanced differential pairs coupled in parallel constitute a low gain transadmittance stage with a relatively large input signal range.

The gain of the known amplifier is controlled by increasing or decreasing the tail currents I1, I2 and I3 fed into the respective common emitters of the three pairs. There are two extreme gain conditions: one wherein the high-gain stage provides the major portion for the output signal, the other wherein the low-gain stage provides the output signal. The tail currents determine the weighted contribution of the high gain stage and that of the low-gain stage to the output signal. By suitable control of the tail currents, the controllable amplifier may be set to any gain value between the two extreme gain conditions.

The gain value setting of the known amplifier also affects the DC currents which flow out of the commonly coupled collectors of the differential pairs. The variation of these DC collector currents through the gain control range may be considerable. The load circuit into which these currents flow has to cope with this variation. In the amplifier shown in FIG. 1, the load circuit is formed by diodes D1 and D2. Due to this diode load circuit, the DC collector voltages will vary to a much smaller extent than the DC collector currents. However, there is a reverse to the diode load circuit.

The gain controllable amplifier shown in FIG. 1 falls short on two points. First, the maximum attainable amplifier gain is relatively low. The transimpedance gain of the diode load circuit is relatively low; the diodes provide a rather feeble signal current-to-voltage conversion. This affects the amplifier gain which is the product of the transadmittance gain of the differential pairs coupled in parallel and the transimpedance gain. Secondly, the noise figure of the amplifier is rather high. The shot noise of the diodes appreciably contributes to the overall amplifier noise. Due to the relatively low gain and the high noise figure, the known gain controllable amplifier is ill suited for many types of receivers.

The gain of the known amplifier could be increased and its noise figure could be reduced, if the diodes D1 and D2, shown in FIG. 1, were to be replaced by resistors of sufficiently high value. However, this would significantly expand the DC voltage swing at the collectors.

In summary, the principle of gain control, according to EP-A-0,102,946 intrinsically suffers from a compromise between DC collector voltage variations on the one hand and noise figure and attainable gain on the other hand.

It is an object of the invention to provide a gain controllable amplifier of the above-identified type in which DC collector currents vary to a smaller extent than in the known amplifier. Such a gain controllable amplifier comprises at least one controllable transadmittance stage formed by a plurality of differential pairs coupled in parallel which have mutually coupled control terminals to which an input signal can be applied and which have mutually coupled main current terminals from which an output signal can be taken, characterized in that said gain controllable amplifier comprises means for unbalancing said differential pairs as a function of a gain control signal. The invention further provides a receiver and a gain control method as defined in including a gain controllable amplifier as defined above, change "method as defined in" to comprising the steps of applying an input signal whose amplitude is to be controlled to mutually coupled control terminals of a plurality of differential pairs coupled in parallel, taking an output signal from mutually coupled main current terminals of said differential pairs, and controlling unbalance in said differential pairs.

The invention takes a new approach to gain control. Differential pairs which are mutually coupled in parallel are unbalanced as a function of a gain control signal. These differential pairs effectively form a transadmittance stage. The gain of this stage is the sum of weighted gains of each differential pair. The weight for a differential pair in this sum can be varied by unbalancing the differential pair to a larger or smaller extent.

Hence, it is possible to control the gain without varying the tail currents of the differential pairs, as in the prior art gain controllable amplifier. Consequently, the sum of DC currents at the mutually coupled collectors remains constant.

The invention has more notable features. The bandwidth of a gain controllable amplifier according to the invention is substantially independent of the gain. However, for receivers with gain control circuitry, the invention is favorable in terms of low noise and low distortion.

There are various ways to implement the invention. The unbalance in the differential pairs may be varied smoothly or step-wise. In one alternative, an array of continuously variable offset voltages may be applied to the differential pairs. In the other alternative, offset voltages may be switched between fixed values. Another approach is to change effective emitter surface areas in a differential pair to change the unbalance therein.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

First, the principle of the invention will be further explained and basic variants of the invention will be discussed. Subsequently, embodiments of the invention will be presented by way of example. Next, notable features of the invention will be highlighted with reference to these embodiments. At the end of the description, some alternatives to the embodiments shown will be briefly described.

Figure 1:
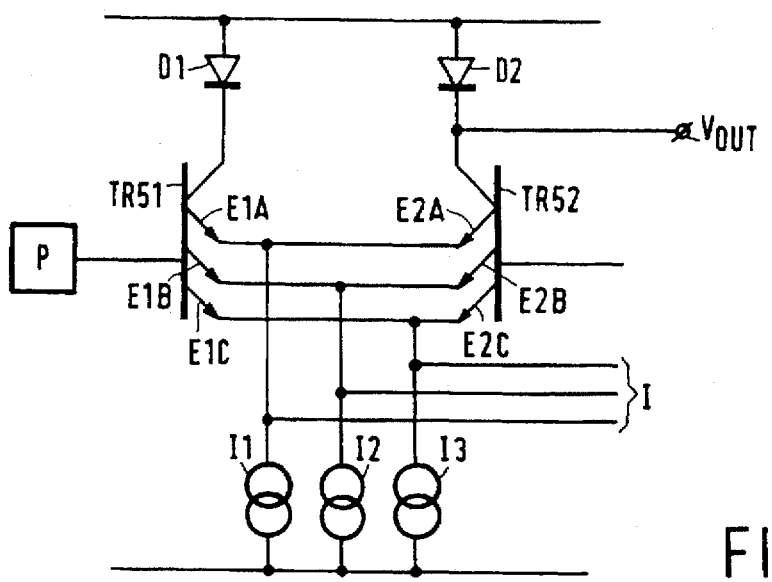
FIG. 1 shows a prior art gain controllable amplifier.
Figure 2:
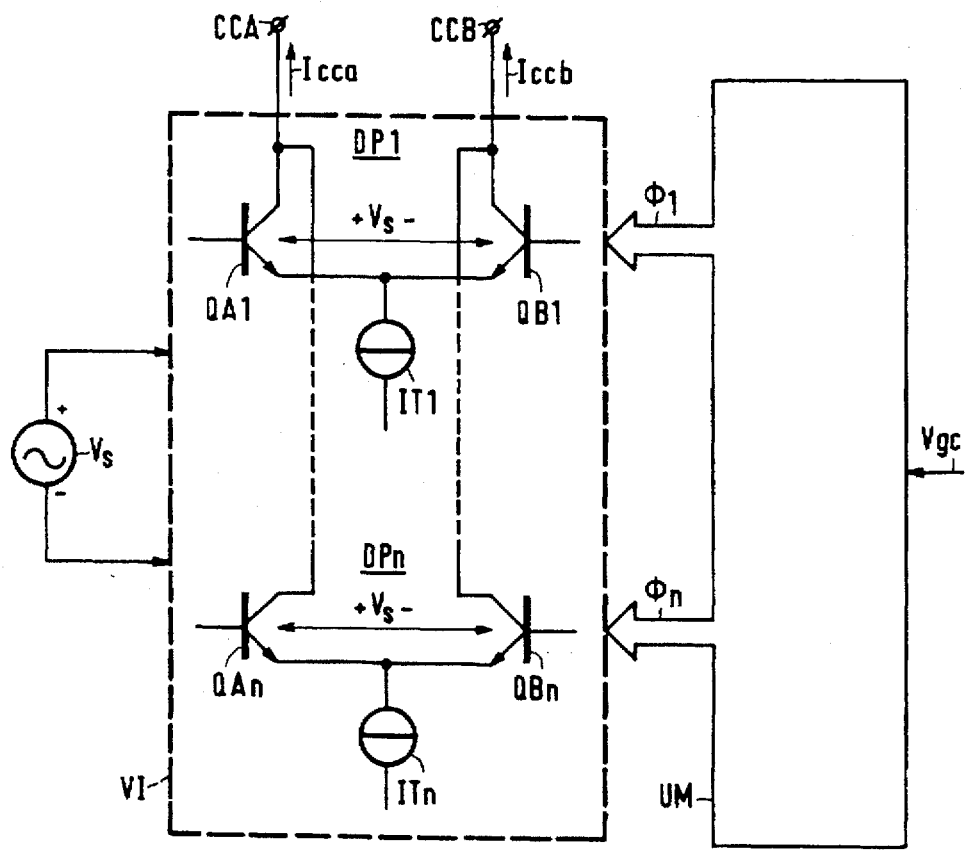
FIG. 2 is a block schematic diagram showing the main parts of the invention.

FIG. 2 is a block schematic diagram showing two main parts of the invention: a transadmittance stage VI, which comprises a plurality of differential transistor pairs DP1 . . . DPn, and means UM to unbalance these differential pairs as a function of a gain control signal Vgc supplied thereto. An AC signal Vs is applied between the bases of the differential pair transistors. An output current Icca or Iccb, respectively, can be taken from each node CCA, CCB of mutually coupled collectors. Tail current sources IT1 . . . ITn supply tail currents to the common emitters of differential pairs DP1 . . . DPn, respectively.

A differential pair splits up the tail current supplied thereto: a portion of the tail current flows to node CCA, the remaining portion to node CCB. There is a dynamic tail current split-up due to the AC signal Vs and a static tail current split-up which is controlled by means UM. The dynamic split-up produces an AC component in the output currents Icca and Iccb, respectively, and the static split-up defines the DC values of these respective output currents.

The static current split-up in a differential pair is expressed in terms of an offset voltage $\Phi 1 \ldots \Phi n$. The offset voltage $\Phi 1 \ldots \Phi n$ indicates the deviation of the smile current split-up from a state of balance. In the state of balance the DC values of differential pair collector currents are equal. An offset voltage is the inverse of a fictitious DC voltage that would have to be added to AC signal Vs at a particular differential pair to achieve this state of balance. Consequently, when the static current split-up of a differential pair is characterized by a non-zero offset voltage, this means that this pair is in a state of unbalance.

The gain of the transadmittance stage V can be controlled through the offset voltages $\Phi 1 \ldots \Phi n$. There are two extreme gain settings. The gain is maximum when all the differential pairs are in state of balance, that is, $\Phi 1 \ldots \Phi n = 0$. The gain is minimum when all the differential pairs are in a state of unbalance and the offset voltages $\Phi 1 \ldots \Phi n$ are equidistant, the equidistance $\Delta \Phi$ being about 40 to 60 mV depending on the type of transistor . used.

These two extreme gain settings are depicted in FIGS. 3a, 3b and 4a, 4b, respectively, for a transadmittance stage which has 4 differential pairs DP1 . . . DP4 in parallel. In this example, all tail current sources IT1 . . . IT4 provide the same tail current It. In these figures, the output current Icca at the node of common collectors CCA is considered in response to the AC signal Vs applied between the bases of the differential pairs. The output current Icca is the sum of all collector currents Ica1 . . . Ica4 of differential pair transistors QA1 . . . QA4, respectively. Given the output current Icca, the output current Iccb is equally defined because the sum of Icca and Iccb equals It.

Figure 3A:
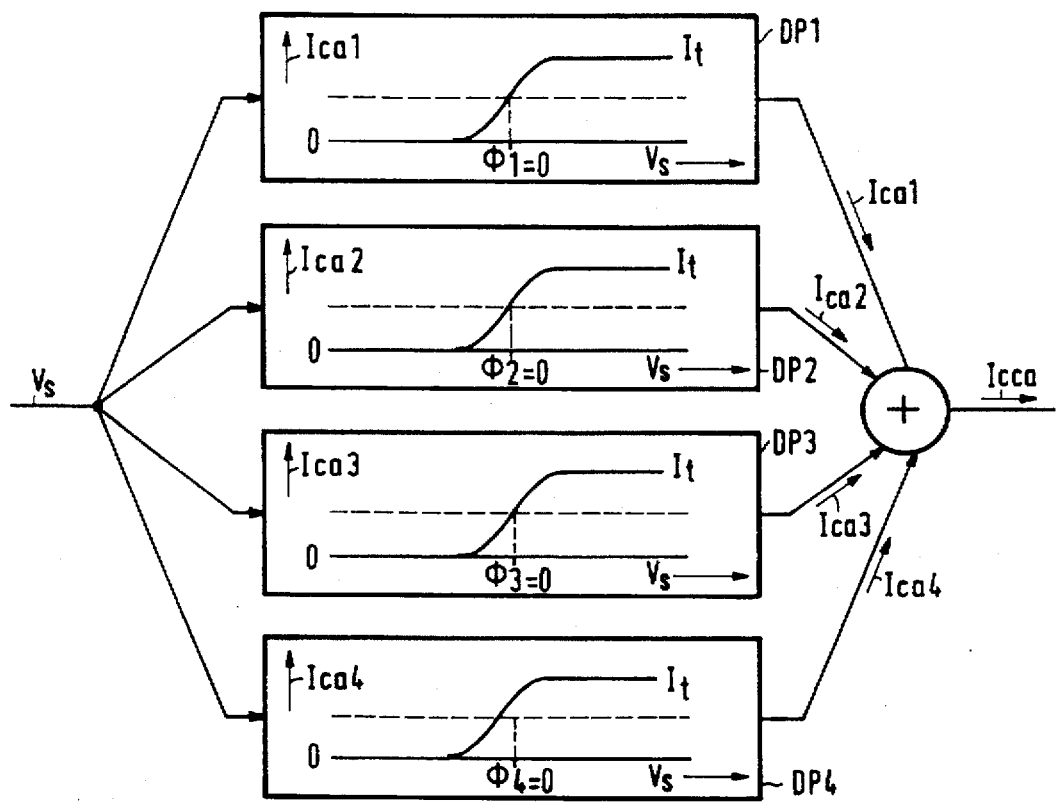
FIGS. 3a and 3b show transfer functions of a transadmittance stage set to maximum gain in accordance with the invention.
Figure 3B:
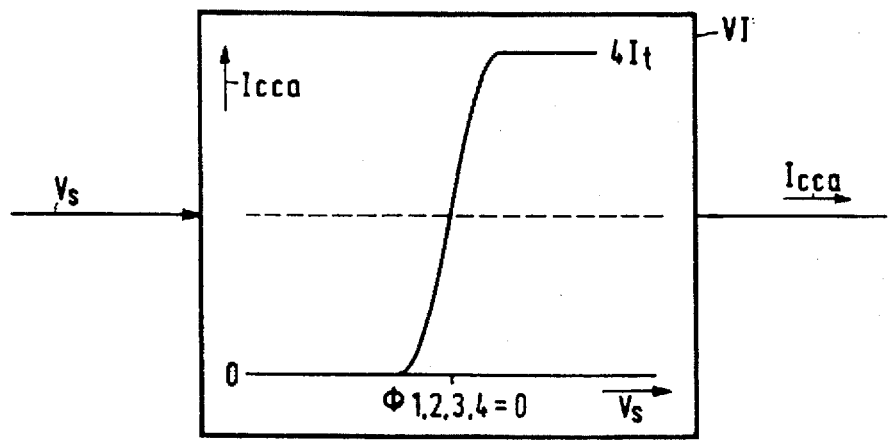
Figure 4A:
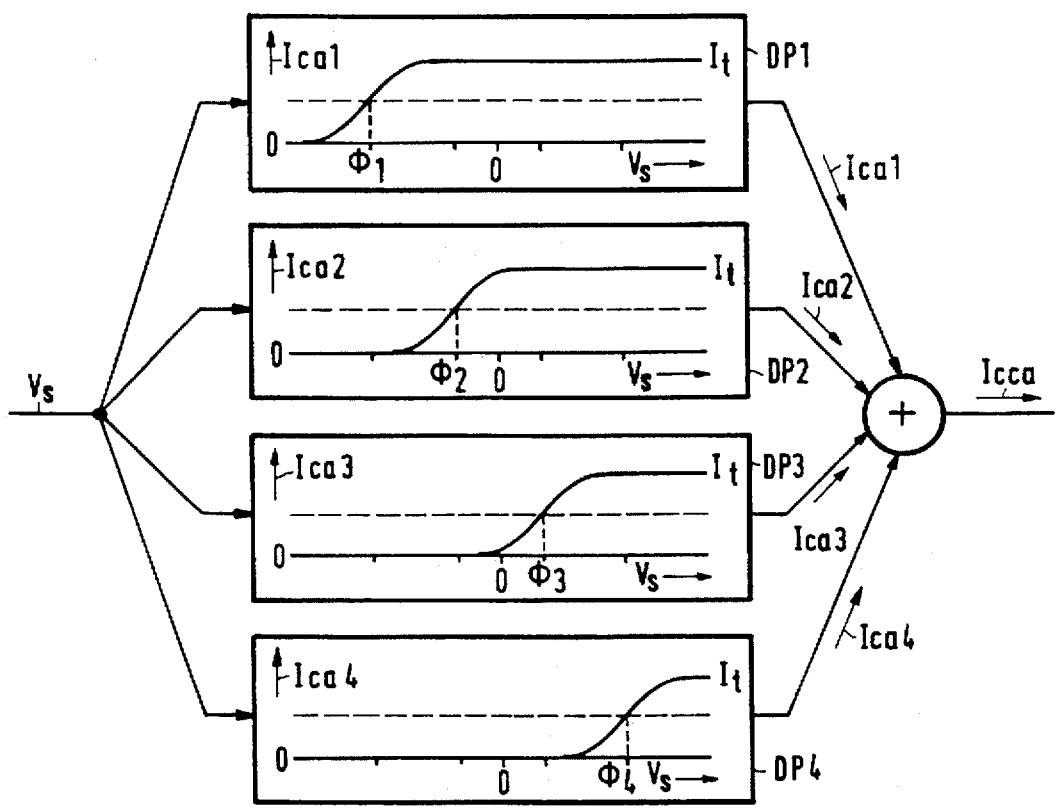
FIGS. 4a and 4b show transfer functions of the transadmittance stage set to minimum gain in accordance with the invention.

FIGS. 3a, and 4a show the transfer functions of each individual differential pair DP1 . . . DP4. In FIG. 3a the transfer functions are identically positioned with respect to signal zero, that is, Vs=0. The output current Icca is 4 times the collector current of one of the differential pair transistors QA1 . . . QA4. The transfer function of the transadmittance stage V, shown in FIG. 3b, is sum of the transfer functions of the differential pairs shown in FIG. 3a. Throughout the input voltage range, each differential pair equally contributes to the output current Icca.

In FIG. 4a, the transfer functions are shifted with respect to signal zero and they are shifted equidistantly with respect to each other. Now, each differential pair provides an AC voltage-to-current conversion for a different portion of the input signal range. For large negative and positive input voltage excursions, DP1 and DP4, respectively, provide a corresponding variation in the output current Icca. For small negative and positive voltage excursions, DP2 and DP3, respectively, take over. Again, the transfer function of the transadmittance stage V, shown in FIG. 4b, is sum of the transfer functions of the differential pairs shown in FIG. 4a.

Figure 4B:
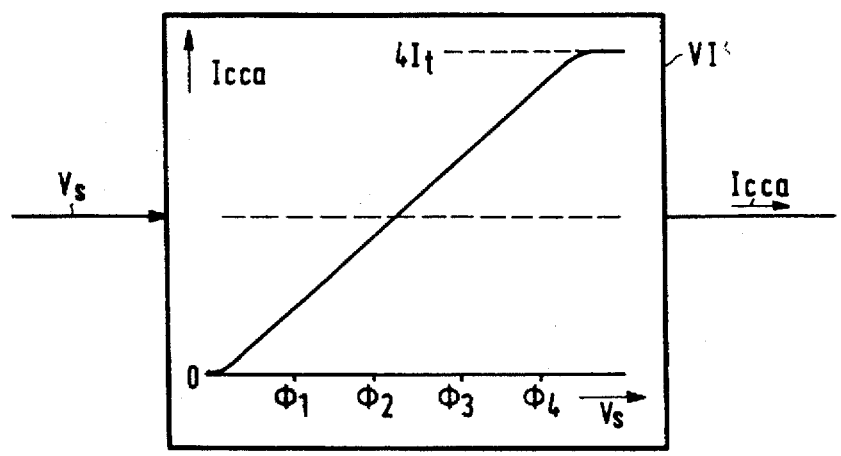

The two extreme gain settings are apparent from FIGS. 3b and 4b. The slopes of the transfer functions shown therein indicate the transadmittance gain. More precisely, the small signal gain of the transadmittance stage V is the first derivative of the transfer function at Vs=0. In FIG. 3b, this derivative is approximately 4 times that in FIG. 4b.

There are two ways in which the gain setting can be varied between these two extremes.

Figure 5A:
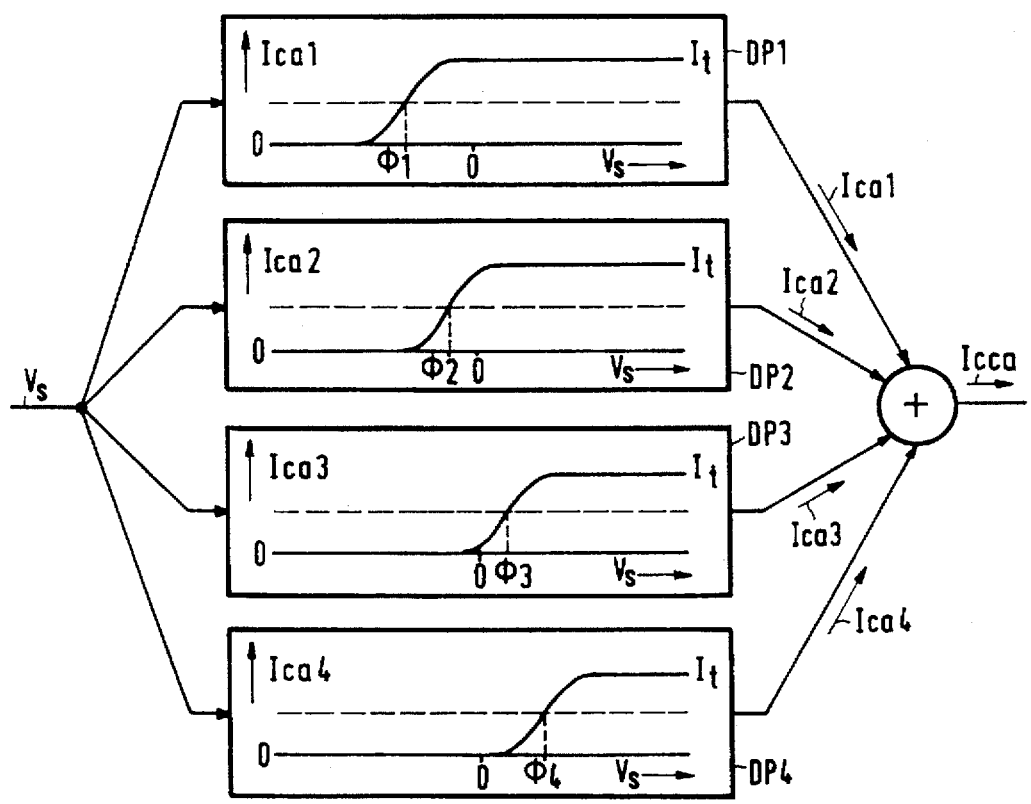
FIGS. 5a and 5b show transfer functions of the transadmittance stage set to intermediate gain according to a first variant of invention.
Figure 5B:
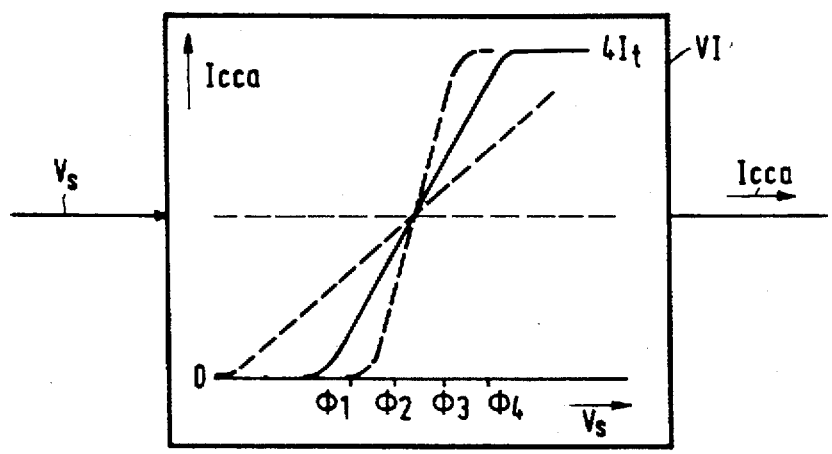

The first way is to vary the equidistance $\Delta \Phi$ of the offset voltages. For example, the equidistance $\Delta \Phi$ can be varied between $\Delta \Phi_{max}$ as in FIGS. 4a and 4b, and zero, as in FIGS. 3a and 3b. In formula: $\Delta \Phi = k \cdot \Delta \Phi_{max}$ in which k is a real number between 0 and 1 which FIGS. 5a and 5b, determines the gain. This provides a smooth and continuous variation, as shown in FIG. 5, from the maximum gain setting, as shown in FIGS. 3a and 3b, and the minimum gain setting as shown in FIGS. 4a and 4b. By suitable control of the equidistance of offset voltages supplied to differential pairs coupled in parallel, the transadmittance gain may be set to any gain value between the maximum and minimum gain setting.

Figure 6A:
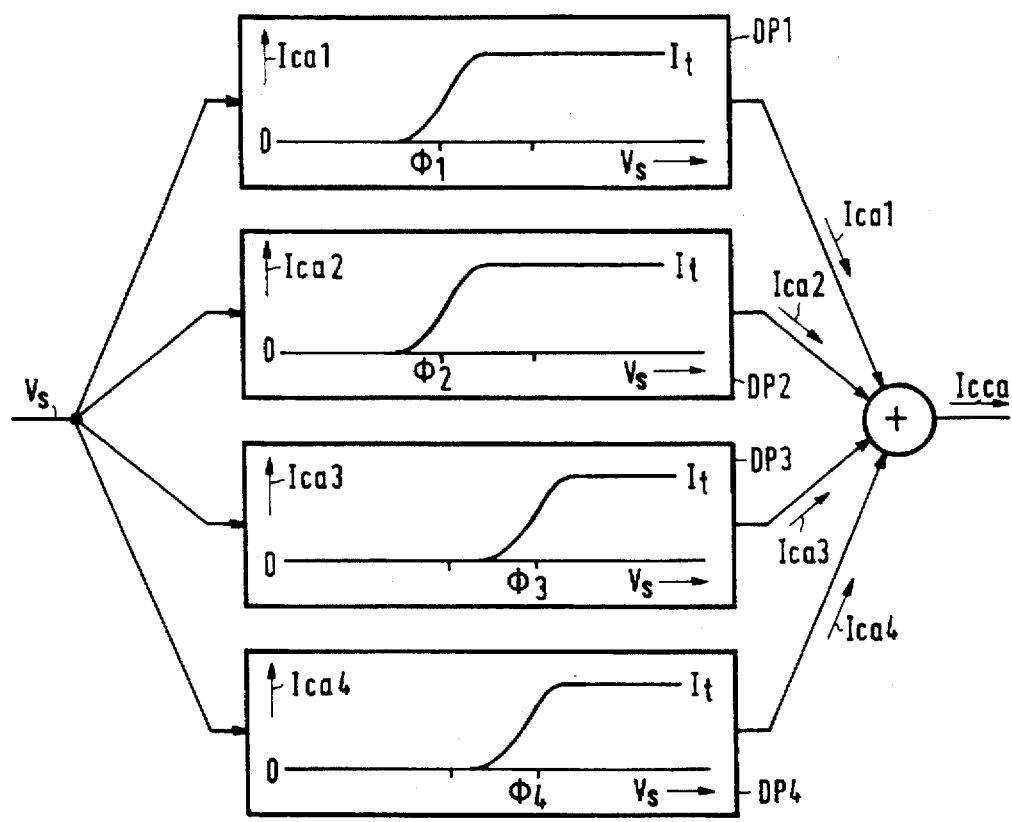
FIGS. 6a and 6b show transfer functions of the transadmittance stage set to intermediate gain according to a second variant of the invention.
Figure 6B:
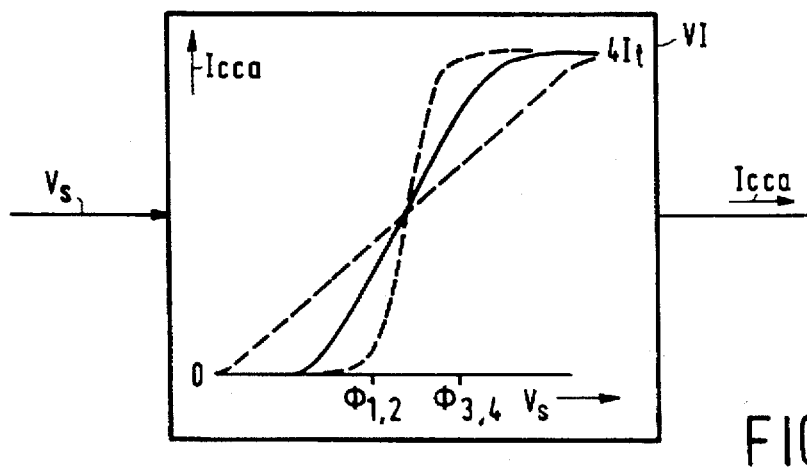

The second way of varying the gain is to switch the offset voltages to constitute groups of two or more differential pairs having similar offset voltages. An equidistant offset voltage remains between differential pairs of different groups. This provides a step-wise variation in gain between the extreme gain settings. FIGS. 6a and 6b show an example of such a step between the gain settings shown in FIGS. 3a, 3b, 4a and 4b. In FIGS. 6a and 6b,. In FIG. 6 differential pairs DP1 and DP2 have the same state of unbalance and differential pairs DP3 and DP4 have the same state of unbalance but different from DP1 and DP2. Compared to Figure FIGS. 4a and 4b, the offset voltages $\Phi 2$ and $\Phi 3$ are maintained but offset voltages $\Phi 1$ and $\Phi 4$ have been switched such that they are equal to $\Phi 2$ and $\Phi 3$, respectively. The transfer function which results therefrom is shown in FIG. 6b. The transadmittance gain is about twice the minimum gain setting and half the maximum gain setting.

In both cases the DC component in the output current Icca and, consequently, Iccb is substantially independent of the gain setting of transadmittance stage V. This can be seen from the transfer functions shown in FIGS. 5b and 6b. In each figure the output current Icca remains 2·It at Vs=0.

Figure 7:
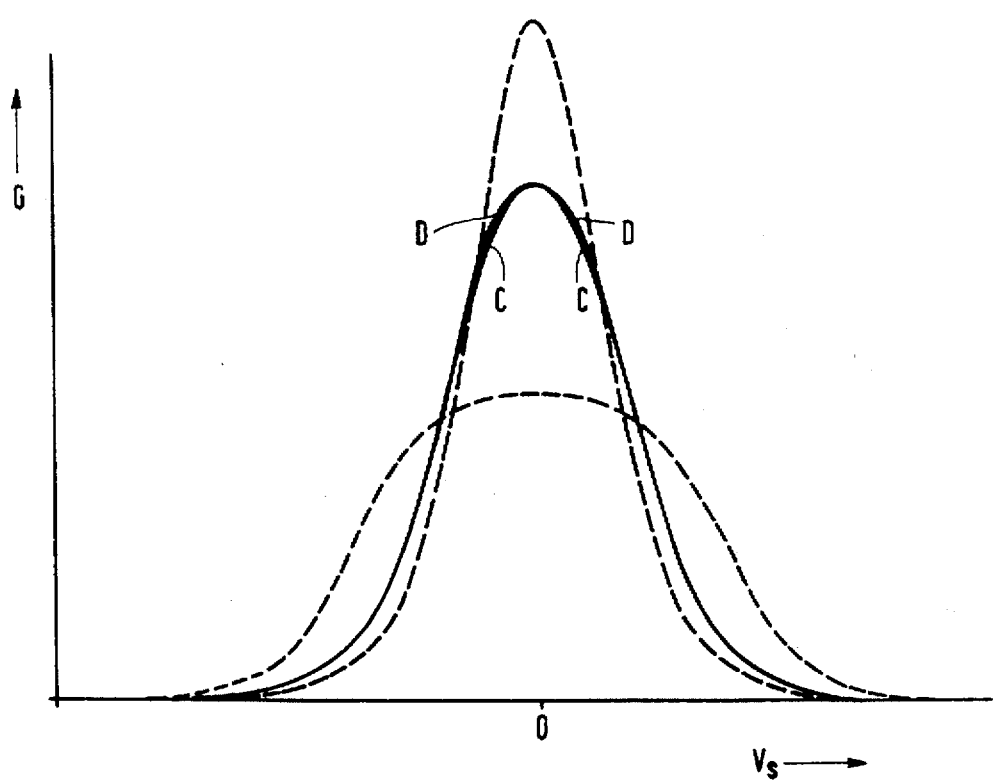
FIG. 7 shows graphs of transadmittance gain against input signal to compare the linear range of the transadmittance stage at various gain settings and, in particular, to compare the first and the second variant of the invention in that respect.

Both ways of varying the gain have their merits. The distortion of a transadmittance stage is slightly less when the second way is used instead of the first. The transfer function depicted in FIG. 6b is slightly more linear than the transfer function depicted in FIG. 5b. This is illustrated more clearly in FIG. 7 The solid-line curves denoted C and D are plots of the first derivatives of the transfer functions shown in FIGS. 5b and 6b, respectively, versus the input signal value Vs. The broken-line curves relate to the extreme gain settings. If a first derivative is independent of Vs, it means that there are no higher-order derivatives which account for harmonic distortion. Hence, the flatness of a plot is a measure of linearity.

The first way of varying the gain allows a setting at any value between the extremes, the second way only at a limited number of values. The resolution of gain variation in discrete steps depends on the number of differential pairs. A relatively high resolution may well require an impractically high number of differential pairs. This can be avoided by combining a form of discrete gain control and a form of continuous gain control. The switching of the offset voltages coarsely sets the gain to best approximate the desired value. Then, the gain is adjusted to the desired value by continuous gain control.

There are several options to implement fine-tuning of the gain between discrete values.

A first option is to adjust the tail current It. Referring to the transfer functions shown in FIGS. 3b, 4b and 6b, the height of the slope, which is 4·It, would vary whereas the width of the slope would remain constant. Consequently, the transadmittance gain varies linearly with the tail current. As in the prior art circuit, the DC value of the output currents Icca and Iccb would equally vary. However, in the invention the variation is smaller. The switching of the offset voltages subdivides the gain control range into smaller portions. Relatively little tail current variation is needed to vary the gain within these smaller portions.

A second option requires two step-wise gain controlled transadmittance stages with different gain values. The gain values are subsequent steps in the discrete gain control characteristics of these stages. A linear combination of the weighted output currents of these transadmittance stages provides a gain value in between the discrete gain values of the individual stages. Varying the weighting factors for the output currents effectuates a fine-tuning of the gain between said discrete gain values.

A further option is to combine the first and the second way of varying the gain through the unbalance of differential pairs as identified above. To illustrate this option, the following example is given for a transadmittance stage with 4 differential pairs. Starting from the extreme gain setting shown in FIGS. 4a and 4b., the gain is increased in a continuous fashion by reducing the equidistance $\Delta \Phi$ between offset voltages $\Phi 1 \ldots \Phi 4$. At a certain gain in between the values associated with FIGS. 4a, 4b, 6a and 6b, offset voltages $\Phi 1$ and $\Phi 2$ are switched in such a way that they are equal. The same applies to offset voltages $\Phi 3$ and $\Phi 4$. Accordingly, DP1, DP2 form a first group of equally unbalanced differential pairs and DP3 and DP4 form a second group of this nature. The difference between offset voltages $\Phi 1=\Phi 2$ and $\Phi 3=\Phi 4$ is chosen to be such that there is substantially no discontinuity in the gain control characteristic. Now, the gain can be further increased by decreasing the difference in offset voltages. At a certain point, the setting, shown in FIGS. 6a and 6b, is obtained, beyond which the difference between $\Phi 1=\Phi 2$ and $\Phi 3=\Phi 4$ is further decreased until the difference is zero. In that case, the maximum gain setting, shown in FIGS. 3a and 3b, is reached.

Two embodiments of the invention will now be presented by way of example.

Figure 8:
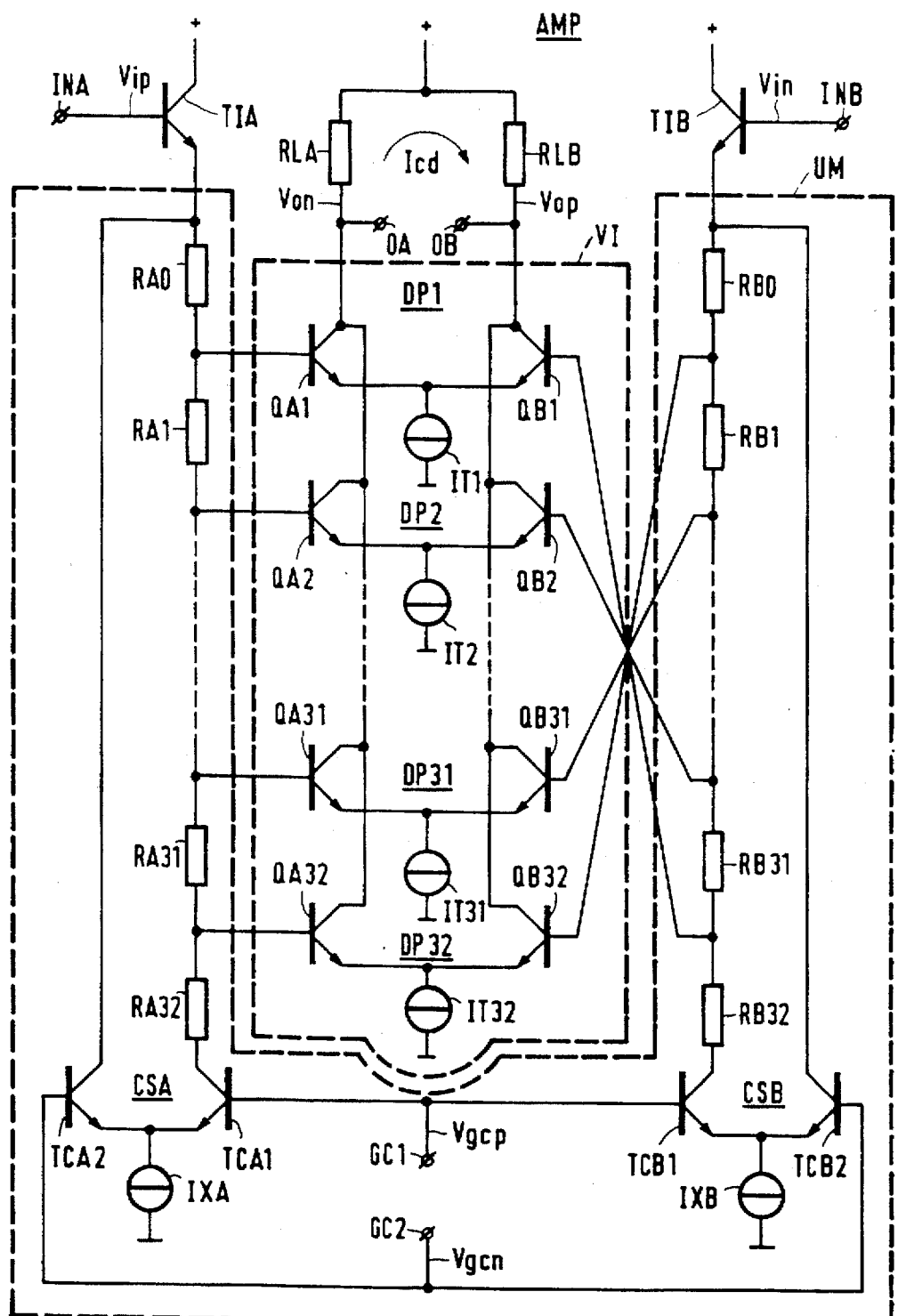
FIG. 8 is a circuit diagram of a first gain controllable amplifier according to the invention.

FIG. 8 shows a gain controllable amplifier section AMP. A differential input voltage Vip-Vin can be applied at a pair of inputs INA, INB. A differential output voltage Vop-Von in response thereto can be taken from a pair of outputs OA, OB. A differential voltage VgCp-Vgcn applied at the pair of gain control terminals GC1, GC2 controls the gain A=(Vop–Von)÷(Vip–Vin).

The differential input voltage Vip-Vin is transferred to the base terminals of differential pairs DP1 . . . DP32 via buffer transistors TIA and TIB. These differential pairs constitute a transadmittance stage VI which converts the differential input voltage into a differential collector current Icd which flows through load resistors RLA and RLB. These resistors convert the differential collector current Icd into the differential output voltage at the pair of outputs OA, OB.

DC offset voltages are superimposed on the differential input voltage Vip-Vin to unbalance the differential pairs DP1 . . . DP32 as a function of the gain control voltage. Means UM to unbalance the differential pairs comprise two resistor ladder networks RA0 . . . RA32 and RB0 . . . RB32 coupled between the buffer transistors TIA and TIB, and the base connections of differential pair transistors QA1 . . . QA32 and QB1 . . . QB32, respectively. The ladder network resistors have equal values. Equal DC currents flow, originating from current sources IXA and IXB, respectively, through each of these resistor networks. Hence, each resistor produces the same voltage drop which will be further referred to as unit voltage drop $\Delta V$.

Each differential pair is unbalanced with a different DC offset voltage. The DC offset voltage is an integer (k) times the unit voltage drop $\Delta V$. The integer (k) is defined through the anti-symmetric connection of the differential pairs to the ladder networks. For example, consider the DC offset voltage superimposed on the input voltage Vip-Vin to unbalance the differential pair DP1. The base of transistor QA1 is connected to the first tap of the ladder network seen from the emitter of buffer transistor TIA. The base of transistor QB1 is connected to the thirty-second tap of the ladder network seen from the emitter of buffer transistor TIB. There is one unit voltage drop from the emitter of buffer transistor TIA to base of transistor QA1. There is voltage drop of 32 times the unit voltage drop from the emitter of buffer transistor TIB to the base of transistor QB1. Hence, the DC offset voltage which unbalances differential pair DP1 is (32−1) times the unit voltage drop, that is, k=+31. Similarly, one can derive the DC offset voltages for the other differential pairs.

Means UM unbalances the differential pairs DP1, DP2, DP3 ... DP30, DP31, DP32 with DC offset voltages of +31, +29, +27 ... −27, −29, −31 times the unit voltage drop, respectively. The equidistant offset voltage $\Delta\Phi$, that is, the difference in DC offset voltage between two subsequent differential pairs DPi,DP(i+1), is the unit voltage drop: $\Delta\Phi = 2 \cdot \Delta V$.

The equidistant offset voltage $\Delta\Phi$ depends on the differential gain control voltage Vgcp-Vgcn applied at the pair of gain control terminals GC1,GC2. The equidistant offset voltage varies with the DC currents which flow through the resistor ladder networks. Differential pairs CSA and CSB act as current splitters which route a portion of the DC currents provided by sources IXA and IXB, respectively, to flow through the ladder networks. The setting of these current splitters is determined by gain control voltage Vgcp-Vgcn.

There are two extreme settings. The first extreme setting is when Vgcp-Vgcn is such that transistors TCA2 and TCB2 are conducting whereas TCA1 and TCB1 are non-conducting. For example, when Vgcp-Vgcn is −200 mV. In that case, no current flows through the resistor ladder networks and the equidistant offset voltage is 0. Consequently, the transfer functions of the differential pairs coincide. Each differential pair equally contributes to the output voltage Vop-Von independent of the value of the input voltage Vip-Vin. This is the maximum gain setting of the amplifier section AMP.

The second extreme setting is when Vgcp-Vgcn is such that transistors TCA1 and TCB1 are conducting whereas TCA2 and TCB2 are non-conducting. For example, when Vgcp-Vgcn is +200 mV. In that case, all the current from sources IXA and IXB flows through the respective resistor ladder networks. Then, the equidistant offset voltage is maximum ($\Delta\Phi_{max}$) and the transfer functions of the differential pairs are maximally shifted with respect to each other. When an AC signal which has a small amplitude, say 1 mV, is applied to the pair of input terminals INA,INB, only differential pairs DP15 and DP16 (not shown) will contribute to the AC signal at the pair of output terminals OA, OB. This is the minimum gain setting.

Figure 9A:
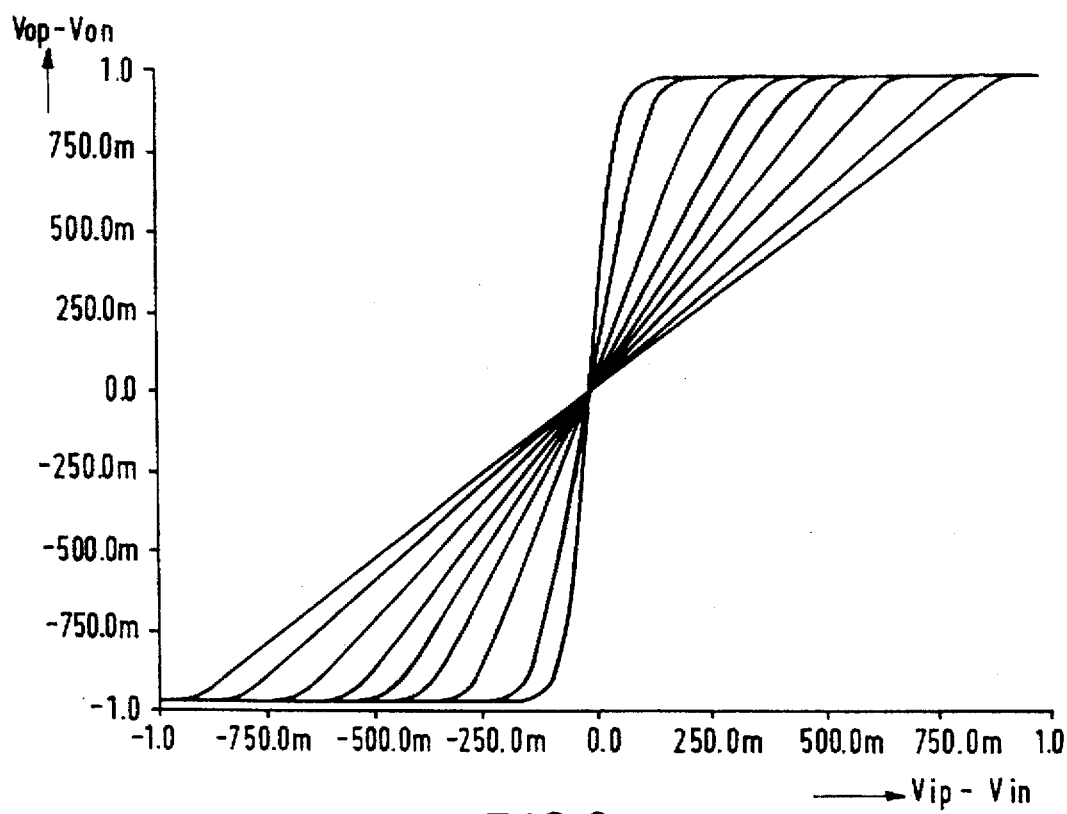
FIGS. 9a and 9b show gain control characteristics of the first gain controllable amplifier.

FIG. 9a shows transfer function plots of the gain controllable amplifier section AMP shown in FIG. 8. The differential gain control voltage Vgcp-Vgcn is the running parameter. The values of the gain control voltage were −100 mV, −50 mV, −25 mV, −10 mV, 0, +10 mV, +25 mV, +50 mV and +100 mV, respectively. The plots relate to the following component values. Each tail current sources IT1 ... IT32 provides 40 µA. The load resistors RLA and RLB are chosen to be such that the maximum voltage gain is 25 dB, that is, RLA and RLB are 750 Ohm resistors. The value of the resistors in the ladder network is 10 Ohms. The two current sources IXA, IXB provide 3 mA each. As a result, the maximum equidistant offset voltage $\Delta\Phi_{max}$ is 2·30 mV=60 mV. A lower value of $\Delta\Phi_{max}$ would have resulted in a smaller gain control range; a higher value would have resulted in a less linear transfer function at the minimum gain setting.

Figure 9B:
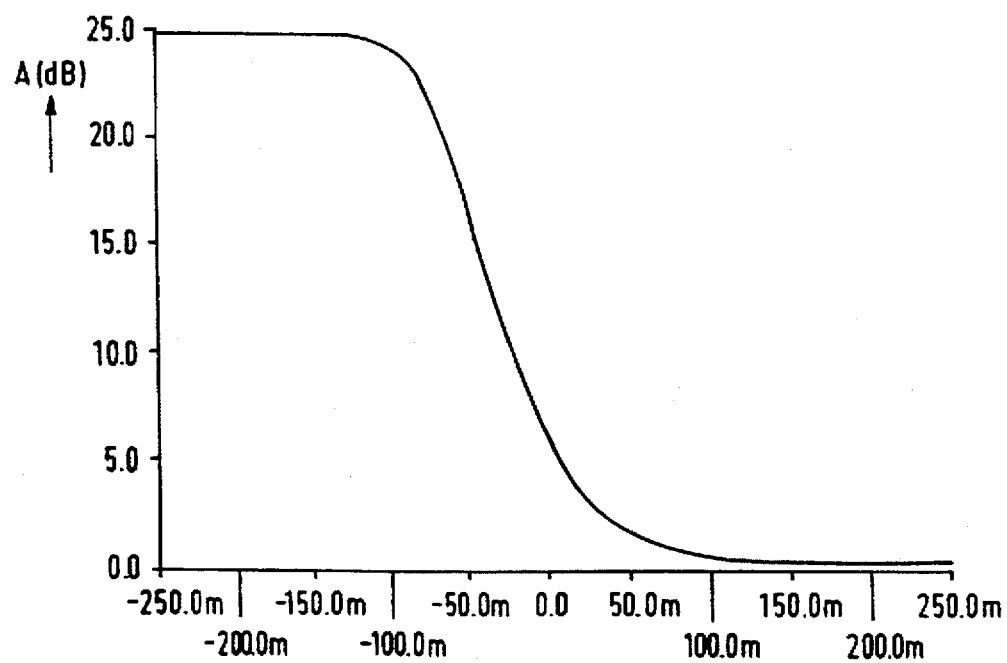

FIG. 9b depicts the gain control characteristic of the gain controllable amplifier AMP having the above-identified component values. In this Figure, the small signal voltage gain is plotted versus the differential gain control voltage Vgcp-Vgcn. The small signal voltage gain is the value of the first derivative of the transfer function at Vip-Vin=0. As is apparent from FIG. 9a, the first derivative varies with the gain control voltage.

Figure 10:
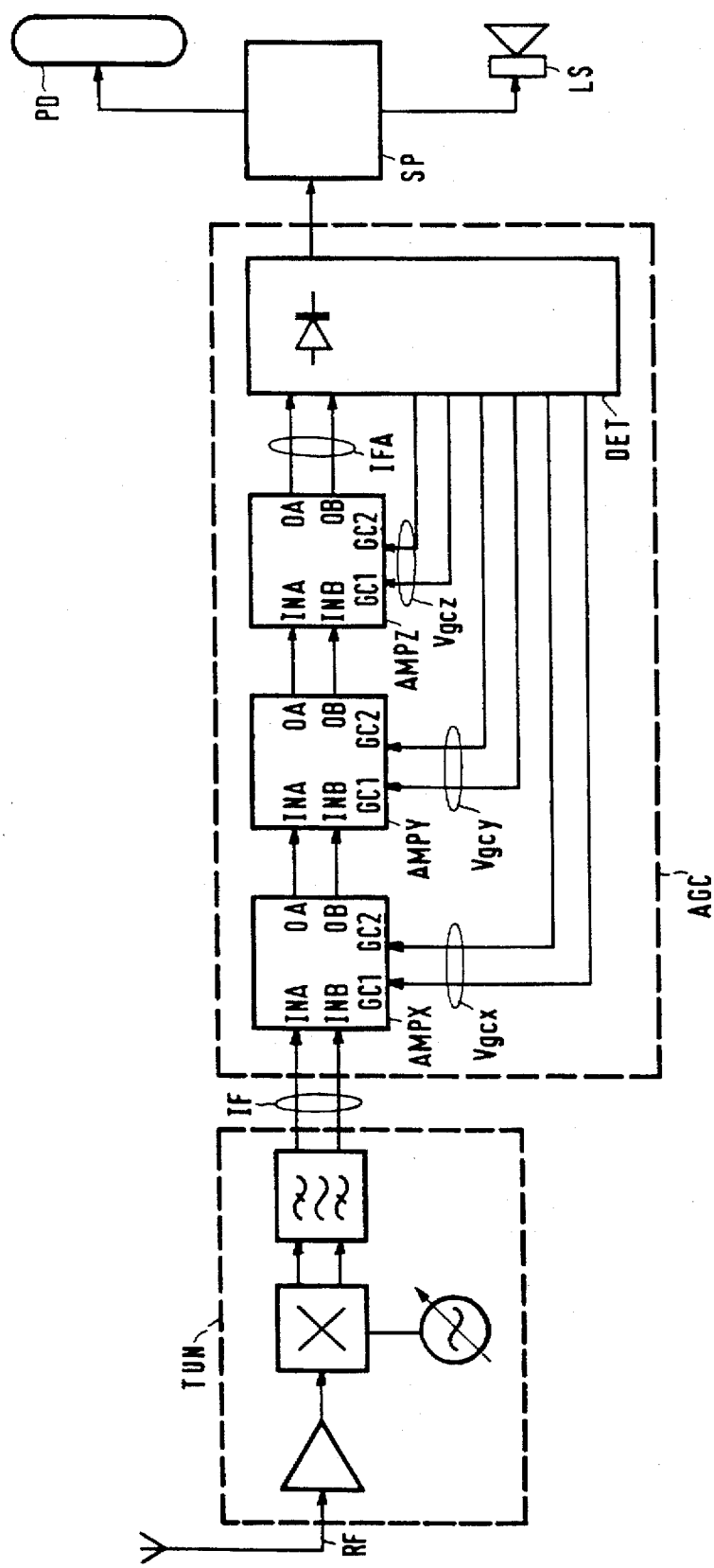
FIG. 10 is a block schematic diagram of a receiver according to the invention.

FIG. 10 shows a television receiver according to the invention which comprises a cascade of three gain controllable amplifier sections AMPX, AMPY and AMPZ identical to that shown in FIG. 8. The receiver further comprises a tuner TUN which receives an RF input signal and converts this signal into an intermediate frequency. A differential intermediate frequency signal IF is supplied to the pair of inputs of section AMPX. The cascade AMPX, AMPY and AMPZ amplifies this intermediate frequency signal. The amplified intermediate frequency signal, denoted as IFA, is supplied to a detector circuit DET. This circuit DET retrieves desired video and audio information which is further processed in signal processor SP to provide input signals for the picture display device PD and the loudspeaker unit LS.

The cascade of the three controllable amplifier sections forms part of an Automatic Gain Control circuit AGC. The purpose of the AGC is to keep the amplitude of the intermediate frequency signal IFA at a reference value. The gain setting of the amplifier sections AMPX, AMPY and AMPZ results from a comparison of the amplitude with the reference value. The detector circuit DET performs this comparison and provides the gain control signals Vgcx, Vgcy and Vgcz. If the amplitude deviates from the reference value the gain control voltage is adjusted and, consequently, the gain of the amplifier sections AMPX, AMPY and AMPZ to bring the amplitude to the reference value. When the amplifier sections have a gain control characteristic as shown in FIG. 9b, the gain of the cascade can be varied approximately between 0 and 75 dB. In that case, the AGC straightens in a range of 75 dB amplitude variations in the intermediate frequency signal IF from the tuner TUN.

Figure 11:
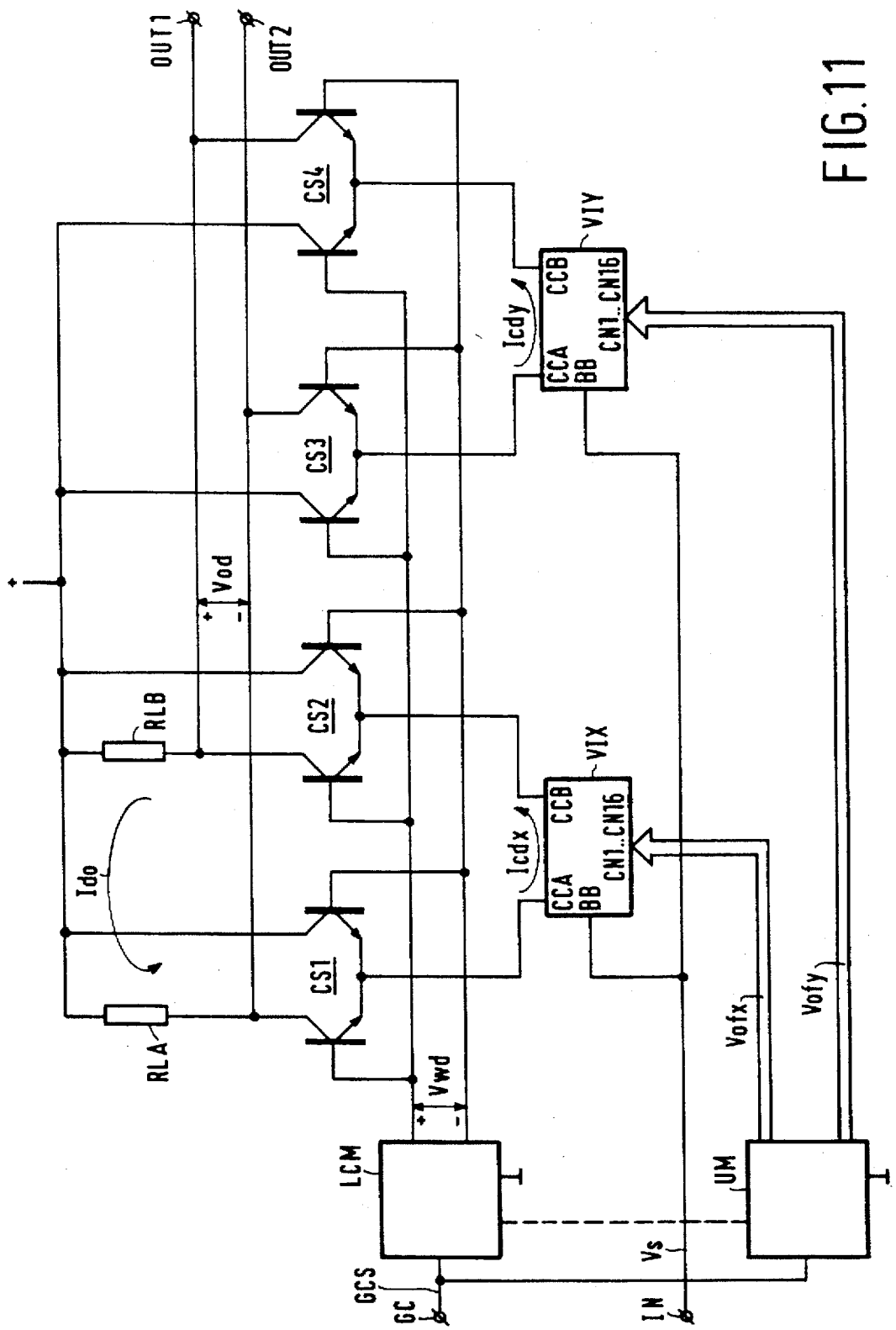
FIG. 11 is a block schematic diagram of a second gain controllable amplifier according to the invention.

FIG. 11 shows a further embodiment of a gain controllable amplifier according to the invention. It has an input IN for receiving an input voltage Vs and a pair of differential outputs OUT1, OUT2 from which an output voltage Vod can be taken. The gain from input IN to the pair of outputs OUT1, OUT2 is controlled by a gain control signal GCS at gain control terminal GC.

In the gain controllable amplifier shown in FIG. 11, transadmittance stages VIX and VIY convert the input voltage Vs into two differential currents Icdx and Icdy, respectively. Portions of these currents are routed to load resistors RLA and RLB via current splitters CS1,CS2 and CS3,CS4, respectively. These load resistors convert the sum of the weighted contributions of Icdx and Icdy into differential output voltage Vdo.

The gain of transadmittance stages VIX and VIY and the muting of their output currents depend on the gain control signal GCSx. The gain of VIX and VIY is varied step-wise, the muting is continuously variable. Means UM convert the gain control signal GCS into two sets of offset voltages Vofx and Vofy. These offset voltages determine the gain of transadmittance stages VIX and VIY, respectively. Means LCM convert the gain control signal into a weighting control voltage Vwd. This control voltage Vcd determines the setting of the current splitters CS1 ... CS4 and, consequently, the portions of differential currents Icdx and Icdy that are routed to resistors RLA and RLB.

Figure 12:
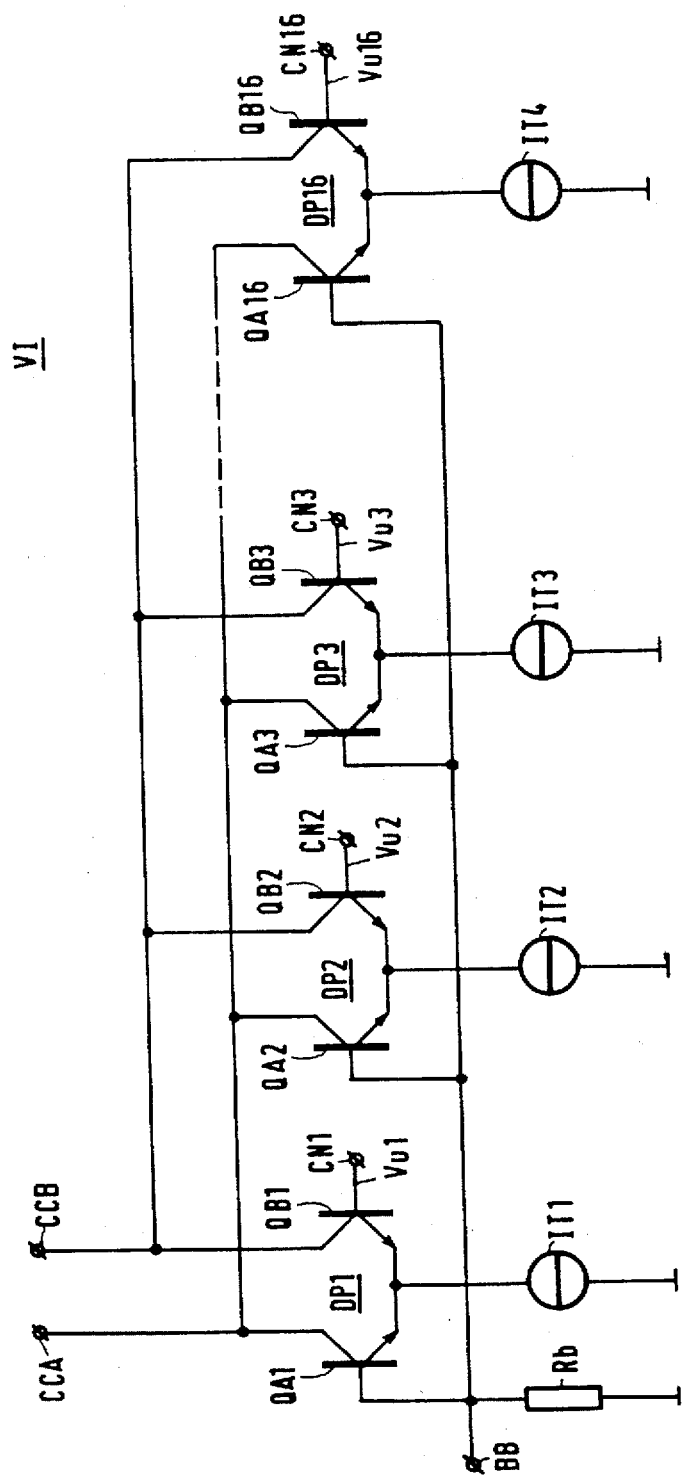
FIG. 12 shows, in greater detail, the transadmittance stages in the second gain controllable amplifier.

The structure of transadmittance stages VIX and VIY is shown in FIG. 12. There are 16 differential pairs DP1 ...

DP16 coupled in parallel each having a tail current source IT1 ... IT16, respectively. A differential current, Icdx or Icdy in FIG. 11 can be taken, from the terminals of commonly coupled collectors CCA and CCB. The bases of transistors QA1 ... QA16 in the respective differential pairs are mutually coupled. Via terminal BB the AC input voltage Vs is supplied to said bases and via resistor Rb a reference DC voltage is applied. The bases of the other differential pair transistors QB1 ... QB16 are individually accessible via terminals CN1 ... CN16, respectively. An offset voltage, Vu1, ..., Vu16, for unbalancing differential pairs DP1... ., DP16, respectively, can be applied to each of the bases via the terminals CN1–CN16. The offset voltages are both of the set Vofx or Vofy shown in FIG. 11.

The offset voltages Vu1 ... Vu16 assume discrete values as shown in Table 1. There are five gain settings MIN, LOW, MED, HIGH and MAX. At gain setting MAX, all offset voltages Vu1 ... Vu16 are zero, that is, all differential pairs DP1 ... DP16 are balanced. At gain setting MIN, all offset voltages are different with an equidistance of 60 mV. At gain settings LOW, MED and HIGH between MAX and minimum MIN groups of differential pairs are identically unbalanced. For example, at gain setting MED, the differential pairs DP1 ... DP4, DP5 ... DP8, DP9 ... DP12 and DP13 ... DP16 form respective groups which receive identical offset voltages. There is an equidistance in offset voltage of 60 mV between these groups.

TABLE 1

| | MIN | MIN | LOW | MED | HIGH | MAX |
|---|---|---|---|---|---|---|
| Vu1 (mV) | −450 | −210 | −90 | −30 | 0 | |
| Vu2 | −390 | −210 | −90 | −30 | 0 | |
| Vu3 | −330 | −150 | −90 | −30 | 0 | |
| Vu4 | −270 | −150 | −90 | −30 | 0 | |
| Vu5 | −210 | −90 | −30 | −30 | 0 | |
| Vu6 | −150 | −90 | −30 | −30 | 0 | |
| Vu7 | −90 | −30 | −30 | −30 | 0 | |
| Vu8 | −30 | −30 | −30 | −30 | 0 | |
| Vu9 | +30 | +30 | +30 | +30 | 0 | |
| Vu10 | +90 | +30 | +30 | +30 | 0 | |
| Vu11 | +150 | +90 | +30 | +30 | 0 | |
| Vu12 | +210 | +90 | +30 | +30 | 0 | |
| Vu13 | +270 | +150 | +90 | +30 | 0 | |
| Vu14 | +330 | +150 | +90 | +30 | 0 | |
| Vu15 | +390 | +210 | +90 | +30 | 0 | |
| Vu16 | +450 | +210 | +90 | +30 | 0 | |

With offset voltages according to Table 1 the transfer functions of the transadmittance stage, shown in FIG. 12, are relatively linear at gain settings other than MAX. Non-linearities in the tangent-hyperbolic transfer functions of differential pairs as such compensate. The ratios between the transadmittance gains for setting MIN, LOW, MED, HIGH and MAX is approximately 1 ... 10.

The gain control of the amplifier shown in FIG. 11 is as follows. The gain setting of transadmittance stages VIX and VIY provides a coarse control. The routing of their output currents by current splitters CS1 ... CS4 provides a fine control. The range of this fine control has two extremes. One extreme is defined by the gain of transadmittance stage VIX, the other extreme by the gain of VIY. By adjusting the gain of these stages, which is the coarse control, the fine control range can be changed.

For example, the gain of VIY is set to HIGH, the gain of VIX is set to MAX. At one extreme of the fine control range, only the transadmittance stage VIX contributes to the output voltage Vod. For example, if the weighting voltage Vwd is +200 mV, then the amplifier gain is $G(MAX) \cdot R(load) = A$ (max); G(MAX) being the transadmittance gain of VIX, which is set to MAX, R(load) being the sum of the RLA, RLB resistor values. At the other extreme of the fine control, only the transadmittance stage VIY contributes to the output voltage Vod. For example, if the weighting voltage Vod is −200 mV, the amplifier gain is a fraction lower. To be precise, the amplifier gain is $G(HIGH) \cdot R(load) = A(high)$.

By varying the weighting voltage Vwd between −200 and +200 mV, the amplifier can be set at any gain value between A(max) and A(high). In that case, a portion of the differential output current Icdx of stage VIX contributes to the output voltage Vod and a portion of the differential output current Icdy of stage VIY. This is in accordance with the following expression:

$$Vod = Iod \cdot R(load) = \{x \cdot Icdx + (1-x) \cdot Icdy\} \cdot R(load)$$

in which x is a real number between 0 and 1, boundaries included. The value of x depends on the weighting voltage Vwd; x→1 when Vwd=+200 mV, x~½ when Vwd=0, x·0 when Vwd=−200 mV. By substituting the following relations: $A = Vod \div Vs$, $Icdx = G(MAX) \cdot Vs$ and $Icdy = G(HIGH) \cdot Vs$, in the above expression it can be rewritten to obtain the following expression for the amplifier gain A within the fine control range:

$$A = x \cdot A(max) + (1-x) \cdot A(high); \quad x = f(Vwd)$$

If, for example, an amplifier gain A is required which is lower than A(high), the above fine control range is changed. The transadmittance gains of stages VIX and/or VIY are adjusted to obtain a new fine control range which covers the desired amplifier gain. The gain of transadmittance stage VIX can be kept one step higher than the gain of transadmittance stage VIY. In that case, there are four fine control ranges: a first from A(min) to A(low), a second from A(low) to A(med), a third from A(med) to A(high) and a fourth from A(high) to A(max).

The gain control signal GCS may be in the form of a binary gain control word. In that case, the most significant bits determine the gain setting of transadmittance stages VIX and VIY. Means UM convert these most significant bits into required sets of offset voltages Vofx and Vofy according to Table 1. These sets of offset voltages are supplied to the respective stages and unbalance the differential pairs in these stages. Accordingly, the gain of transadmittance stages VIX and VIY is set to MIN, LOW, MED, HIGH or MAX.

The least significant bits of the digital gain control signal GCS determine the weighted contribution of transadmittance stages VIX and VIY to the overall amplifier gain. Means LCM convert these least significant bits into a weighting voltage Vwd which controls the current splitters CS1 ... CS4. The setting of these current splitters determines the portion of the differential output currents Icdx, Icdy of the respective stages which flows into resistors RLA, RLB. Accordingly, the amplifier gain is set to a desired value in a fine control range defined by the gain setting of transadmittance stages VIX and VIY.

Means UM and LCM in FIG. 11 are not shown in further detail. A person skilled in the art will readily be able to conceive various embodiments. For example, means LCM may comprise a D/A converter to provide the desired conversion of signal GCS into voltage Vwd. This D/A converter may be preceded by some decoding circuitry to translate the least significant bits of GCS into a suitable D/A converter input word.

Means UM may comprise an array of controllable DC sources to provide the offset voltages Vu1 ... Vu16 for the sets Vofx and Vofy, respectively. The DC voltages of these sources are switchable between discrete values corresponding to those in Table 1. Decoding circuitry can convert the most significant bits of GCS into control signals to individually set the DC voltage of each source.

Some notable features of the invention will now be described in greater detail.

It is possible to achieve low noise and low distortion in AGC circuits and, in particular, in receivers, according to the invention. In many receivers controllable amplifiers are used to reduce amplitude variations of a reception signal. The gain of a controllable amplifier is set to maximum when the input signal amplitude is relatively small. When the input signal amplitude increases, the gain of the controllable amplifier is decreased.

The linear range of the controllable amplifier changes with the gain setting in a desired fashion. This is shown in FIGS. 5b, 6b and 9a in which the slope of the transfer function relates to the gain. At a maximum gain setting, the linear range seen at the input is smallest. This is in accordance with the input signal amplitude which is relatively small at this setting. The linear range increases when its gain is reduced. The linear range is widest when the gain is set to minimum. In that case, the input signal amplitude is relatively large. Thus, the linear range of the controllable amplifier varies in accordance with the input signal amplitude. This helps to keep the signal distortion low over the gain control range.

Furthermore, the relation between gain and linear range is also favorable in terms of noise. Each differential pair in the gain controllable amplifier contributes to the noise. An optimum signal-to-noise ratio is achieved when all differential stages are driven to full power. This means that the input signal of the controllable gain amplifier extends to the limits of the linear range. See for example FIGS. 5a, 5b, 6a and 6b. In a practical low-noise operation, some margin will be introduced to prevent distortion. The low-noise operation can be maintained over the gain control range or, at least, a substantial potion thereof. This is due to the fact that the limits of the linear range vary in accordance with the input signal amplitude. In effect, the unbalance of the differential pairs is varied over the gain control range in such a way that nearly all pairs are substantially driven to full power.

With respect to noise and distortion, the embodiment shown in FIG. 8 is advantageous over the embodiment shown in FIG. 11. The linear range of the first-mentioned embodiment adapts itself in a continuous fashion. For any change in gain setting, there is a corresponding change in linear range. In contrast, the linear range of the embodiment shown in FIG. 11 varies in discrete steps. The linear range is determined by the transadmittance stage which has the highest gain. For example, consider an input signal which falls within the linear range of stage VIY but which exceeds the linear range of stage VIX. Then, the differential output current Icdx of stage VIX will be distorted and, consequently, the output signal to which both stages contribute.

The same effect also occurs in the gain controllable amplifier known from EP-A-0,102,946, FIG. 5. This controllable amplifier can be considered as two transadmittance stages in parallel. The first transadmittance stage is a balanced differential pair having emitters E1A,E2A. Its linear range is relatively small. The second transadmittance stage consists of two unbalanced differential pairs having emitters E1B,E2B and E1C,E2C, respectively. This stage has a relatively large linear range. Over a part of the gain control range, the first transadmittance stage appreciably contributes to the output signal Vout. Hence, at these gain settings the linear range of the controllable amplifier as a whole will be relatively small. An input signal exceeding this range will be distorted.

A further notable feature of the invention is that it provides gain control with a relatively constant bandwidth. The high frequency (HF) characteristics of a differential pair depend, inter alia, on its tail current. In the invention, tail currents of differential pairs which effectuate gain control can be fixed. Hence, the cut-off frequency of the gain controllable amplifier remains substantially constant over the gain control range. This is in contrast to the known gain controllable amplifier in which the tail current needs to be varied for gain control.

In summary, gain controllable amplifiers with stable HF and DC characteristics, as well as receivers with low noise and low distortion have been described. Such functional units comprise at least one transadmittance stage having differential transistor pairs coupled in parallel. Gain control is effectuated by varying the unbalance in the differential transistor pairs.

While a limited number of embodiments are shown and described to clarify the invention, a person skilled in the art may conceive many other alternative embodiments without departing from the spirit and the scope of the invention claimed.

The term offset voltage in this specification primarily refers to the state of unbalance in a differential pair. The offset voltage quantifies the state of unbalance. In the examples shown, the offset voltage also relates to the amount of differential DC voltage applied to the bases of a differential pair. However, the invention does not confine itself to this technique of unbalancing differential pairs in function of a gain control signal.

The invention provides various ways of unbalancing differential pairs. Applying differential DC voltages to bases of differential pair transistors, as shown in FIGS. 8 and 11, is one possibility. Alternatively, differential DC voltages can be applied to emitters of differential pair transistors. An emitter surface mismatch between transistors is another technique of unbalancing a differential pair. For example, the differential pair may comprise three transistors with identical emitter surfaces in which two transistors are effectively coupled in parallel. By altering the conductance of one of these two transistors, the effective emitter surface mismatch in this differential pair is changed from 1:2 to 1:1, or vice versa. In effect, the two transistors coupled in parallel can be seen as a single differential pair transistor whose emitter surface can be varied.

The offset voltages at the extreme gain settings may, of course, differ from those in the embodiments which have been presented by way of example.

The maximum gain setting of a controllable amplifier does not need to correspond to all differential pairs being in balance, that is, $\Phi 1 \ldots \Phi n=0$ in FIG. 2. A maximum gain setting in which differential pairs are somewhat unbalanced may provide better linearity. Referring to FIG. 8, fixed current sources can be coupled to the resistor ladder networks RA0...RA32, RB0...RB32. In that case, relatively small offset voltages remain when the gain control voltage Vgcp-Vgcn sets the controllable amplifier to maximum value. Then, the transfer function of the transadmittance stage V will be more linear than for a maximum gain setting in which all offset voltages would be zero. However, the maximum gain value will be lower. The potential maximum gain of stage V, when all differential pairs are balanced, is not attained. In effect, gain control range can be traded off for linearity.

Offset voltages at minimum gain setting may vary per design according to the desired linearity and the types of devices used in the differential pairs. With bipolar transistors, an equidistance in offset voltages $\Delta\Phi_{max}$ of 40 to 60 mV will provide a maximally linear transfer function. The actual value depends, inter alia, on the size and the structure of these transistors. If linearity is not of prime importance, a greater equidistance can be chosen for minimum gain setting to extend the gain control range.

Offset voltages need not be symmetric with respect to signal zero. For example, the maximum gain setting in FIG. 3a and 3b could be such that $\Phi1=\Phi2=\Phi3=\Phi4\neq0$. In that case, the transfer functions in these Figures would, horizontally shift to the left or to the right. The transfer functions shown in FIG. 4a and 4b can be shifted accordingly to the left or to the right by adjusting $\Phi1\ldots\Phi4$. Shifts in transfer functions from signal zero may be desired in some cases, for example, if the positive and negative voltage excursions of the input signal are asymmetric.

Equidistance between offset voltages is not required, although preferred in view of linearity. In some cases, non-linearity in the transfer function may even be desirable, for example, to maintain the soft-limiting characteristics of a single differential pair through the gain control range. In such a case, the desired non-linear transfer function is obtained with non-equidistant offset voltages. By varying these non-equidistant offset voltages, the gain of such a soft-limiting transadmittance stage can be adjusted.

Although the invention has been explained with reference to bipolar transistors, transadmittance stages may equally comprise MOS-transistor differential pairs coupled in parallel. A MOS-transistor differential pair also exhibits a transfer function of which the first derivative smoothly increases starting from zero value, reaches a maximum and then decreases until it reaches zero value again. Due to this property, it is possible to smoothly vary the gain of a transadmittance stage by unbalancing the MOS-transistor differential pairs therein. There are gradual transitions between the transfer functions of the MOS-transistor differential pairs when these are offset with respect to each other due to unbalance.

The means for unbalancing the differential pairs as a function of the gain control signal may be implemented in various ways. The mode of realisation will, inter alia, depend on the type of gain control signal which may be digital or analog or a combination of both. In some cases, a specific gain control characteristic is required, that is, the gain versus control signal plot of which FIG. 9b shows an example. Said means may include circuitry that provides the desired gain control characteristic at a gain control terminal. For example, in FIG. 8, a conversion stage may be coupled between the terminals GC1,GC2 and the bases of differential stages CSA and CSB. This is to convert the gain control characteristic seen at said bases into an exponential gain control characteristic seen at the terminals GC1,GC2.

It will be evident that other types of load circuit may replace resistors RLA, RLB shown in FIG. 8 and 11. The way in which the output current of a gain controllable transadmittance stage is converted into an output voltage is not essential to the invention. Moreover, the circuit following the transadmittance stage may provide a different output quantity than a voltage, for example, a current.

Referring to the embodiment shown in FIG. 8, a low resistor value in the ladder networks RA0...RA32 and RB0...RB32 is preferred. The lower the resistor value, the smaller the noise produced by the ladder network. Furthermore, the base currents of the differential pair transistors should be taken into account. These currents flow through the ladder networks and disturb the equidistance in offset voltages. The lower the resistor value, the smaller this disturbance.

It is very well possible to implement the invention as an integrated circuit on a semiconductor body. The integrated circuit may comprise, for example, the AGC circuit shown in FIG. 10 which includes controllable IF amplifier and detector circuits. It is evident that such an integrated circuit can advantageously be applied in many receiver types apart from television receivers, such as radio broadcast receivers, mobile radio receivers, cordless telephones, etc.

In an integrated form, a resistor ladder network as shown in FIG. 8 may comprise a strip of polysilicon. At regular distances the polysilicon strip is in contact with metal layers. The two contacts via which a main current can flow through the strip constitute the ends of the ladder networks. Voltages can be tapped off these contacts and the contacts in between.

In the bulk of the polysilicon strip, the main current will flow parallel to the surface of the semiconductor body. However, at both ends of the ladder, the current has a direction which is orthogonal to the surface of the semiconductor body. As a consequence, only the voltages at contacts which are sufficiently remote from the ends will be equidistant. The polysilicon material at both ends should therefore be used to form dummy resistors, in which the direction of the current changes.

To give an example, the resistor ladder networks RA0...RA32 and RB0...RB32 shown in FIG. 8 comprise dummy resistors RA0, RA32 and RB0 and RB32, respectively. Formed as a polysilicon strip, these resistor ladder networks will produce substantially equidistant voltage drops across resistors RA1...RA31 and RB1...RB31. The voltage drops across RA0, RA32, RB0 and RB32 will deviate.

We claim:

1. A gain-controllable amplifier comprising at least one controllable transadmittance stage formed by a plurality of differential pairs coupled in parallel which have mutually coupled control terminals to which an input signal can be applied and which have mutually coupled main current terminals from which an output signal can be taken, characterized in that said gain controllable amplifier comprises means for providing unbalance within said differential pairs as a function of a gain control signal.

2. A gain controllable amplifier as claimed in to claim 1, wherein said means comprise a continuous control circuit to convert said gain control signal into an array of continuous control voltages and to unbalance a differential pair with a distinct continuous control voltage.

3. A gain controllable amplifier as claimed in claim 2, wherein the continuous control circuit comprises a controllable current source responsive to said gain control signal and an impedance ladder network in series with said controllable current source for providing said continuous control voltages.

4. A Gain controllable amplifier as claimed in claim 3, further comprising an input stage via which an input signal can be applied to said mutually coupled control terminals and wherein said controllable current source comprises a fixed current source in series with a current splitter having a first output which is coupled to an output of said input stage via said impedance ladder network and having a second output which is directly coupled to said output of said input stage.

5. A gain controllable amplifier as claimed in claim 3, formed as an integrated circuit wherein polysilicon semiconductor material constitutes said impedance ladder network with polysilicon dummy resistors at both ends of said impedance ladder network, between which polysilicon dummy resistors other polysilicon resistors are arranged from which said continuous control voltages can be taken.

6. A gain controllable amplifier as claimed in claim 1, wherein said means comprise a discrete control circuit to form subsets of identically unbalanced differential pairs and to adjust the number of subsets as a function of said gain control signal.

7. A gain controllable amplifier as a claimed in claim 6, comprising a first and a second controllable transadmittance stage, a weighting stage coupled between said first and second transadmittance stages and an output of said amplifier to control the relative contribution of the output signals taken from the first and the second transadmittance stage, respectively, to a signal at said output, wherein said means further comprise a weighting control circuit for controlling the weighting stage as a function of the gain control signal.

8. A gain controllable amplifier as claimed in claim 6, wherein said discrete control circuit is arranged to unbalance said groups of differential pairs such that each group of differential pairs is unbalanced with an equidistance in offset of 40 to 60 mV.

9. A gain controllable amplifier as claimed in claim 1, wherein said gain controllable amplifier is formed as an integrated circuit in a semiconductor body.

10. A receiver having an automatic gain control circuit which comprises a gain controllable amplifier as claimed in claim 1.

11. A method of controlling signal amplitudes, comprising the steps:

applying an input signal having an amplitude to be controlled to mutually coupled control terminals of a plurality of differential pairs coupled in parallel;

taking an output signal from mutually coupled main current terminals of said differential pairs; and controlling unbalance within said differential pairs.

* * * * *